(12) United States Patent
Matsui

(10) Patent No.: US 7,439,767 B2
(45) Date of Patent: Oct. 21, 2008

(54) SEMICONDUCTOR INTEGRATED CIRCUIT AND CONSTRUCTION USING DENSELY INTEGRATED CELLS

(75) Inventor: Toru Matsui, Osaka-fu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 108 days.

(21) Appl. No.: 11/442,958

(22) Filed: May 31, 2006

(65) Prior Publication Data

US 2006/0267630 A1    Nov. 30, 2006

(30) Foreign Application Priority Data

May 31, 2005 (JP) ............................. 2005-160481

(51) Int. Cl.
*H03K 19/00* (2006.01)
(52) U.S. Cl. ............................. 326/41; 326/101; 716/17
(58) Field of Classification Search .................. 326/41, 326/47, 101; 716/17
See application file for complete search history.

(56) References Cited

U.S. PATENT DOCUMENTS

2004/0243966 A1* 12/2004 Dellinger ..................... 716/17

FOREIGN PATENT DOCUMENTS

JP          10-313060 A      11/1998

* cited by examiner

*Primary Examiner*—James H. Cho
*Assistant Examiner*—Thienvu V Tran
(74) *Attorney, Agent, or Firm*—McDermott Will & Emery LLP

(57) ABSTRACT

A semiconductor integrated circuit having a first cell row including a plurality of cells disposed in a row direction, each cell having a prescribed cell width in the row direction and at least one input pin provided at a prescribed location in the row direction; and a second cell row that includes a plurality of cells substantially identical in shape to cells of the first row and is parallel to the first cell row, wherein the second cell row is displaced in the row direction relative to the first cell row so that each cell in the second cell row is out of alignment with a corresponding cell in the first cell row.

16 Claims, 15 Drawing Sheets

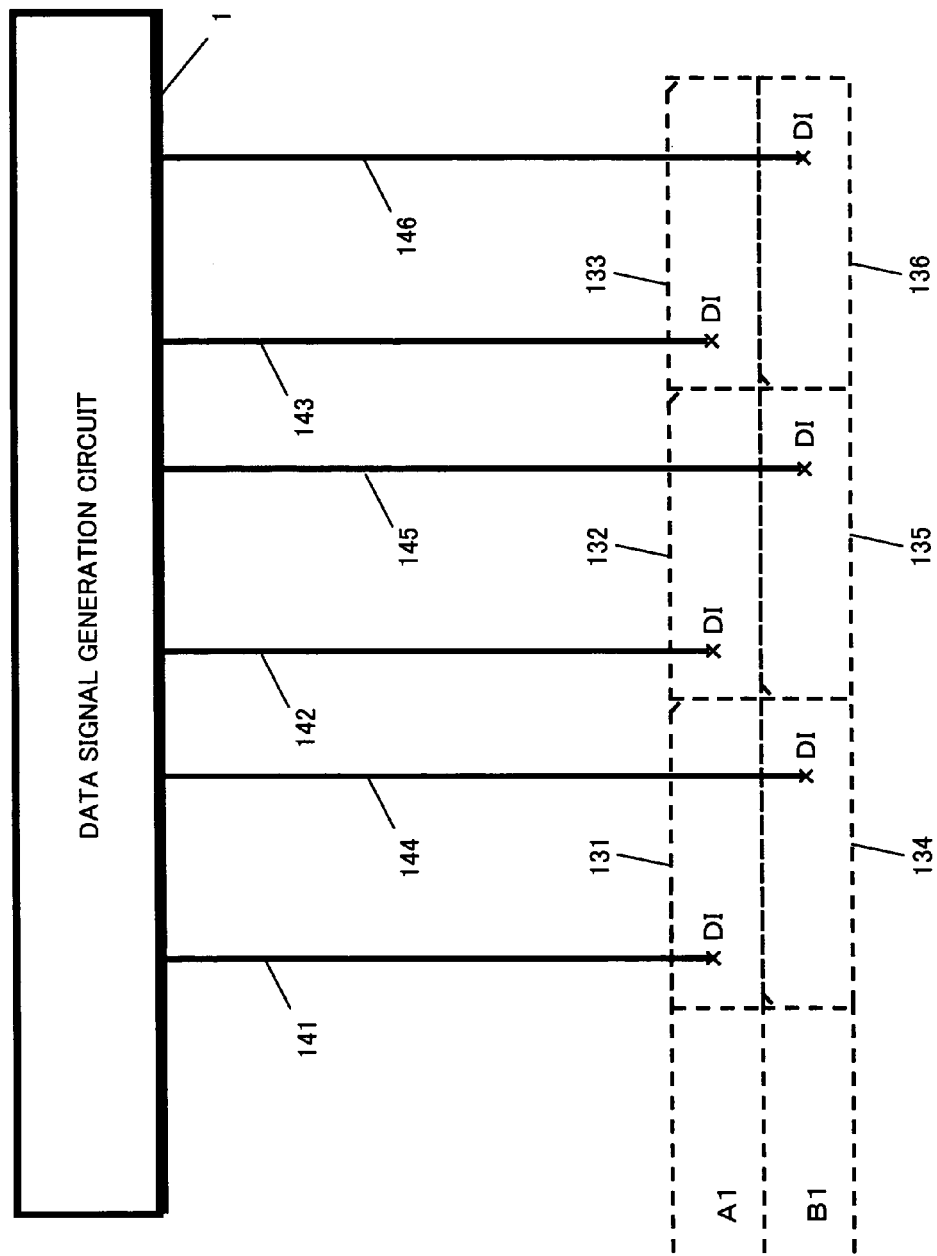

SEMICONDUCTOR INTEGRATED CIRCUIT AND CONSTRUCTION USING DENSELY INTEGRATED CELLS

BACKGROUND OF THE INVENTION (1) Field of the Invention

The present invention relates to semiconductor integrated circuits and especially to a construction using densely integrated cells.

(2) Description of the Related Art

In the field of semiconductor integrated circuit design there exist semi-custom chip design methods known as standard cell methods. According to these methods, chips are designed by combining and arranging logic cells that function as logic circuits.

In the standard cell methods, it is desirable to densely integrate the logic cells and reduce the area of wires connecting to the cells, so as to reduce chip area.

However, when cells of identical width whose input pins have identical width direction locations are arranged in a matrix to form width direction rows and height direction columns, input pin positions of cells in any given column align in an orthogonal direction to the width direction.

Consequently, in the case where input signal wires extend from the height direction, straight signal lines cannot be used within a single wiring layer. Rather, the signal lines must be routed in a roundabout manner, which results in an increase in the amount of wiring required.

This problem is more pronounced in arrays of cells that have a large number of input pins.

SUMMARY OF THE INVENTION

In view of this problem, an object of the present invention is to provide a semiconductor integrated circuit including a plurality of cells each having input pins with identical width direction locations relative to a cell edge and substantially straight input wires. The substantially straight input wires enable a reduction in the amount of wiring required.

In order to solve this problem, the present invention is a semiconductor circuit having: a first cell row including a plurality of cells disposed in a row direction, each cell having a prescribed cell width in the row direction and at least one input pin provided at a prescribed location in the row direction; and a second cell row that includes a plurality of cells substantially identical in shape to cells of the first row and is parallel to the first cell row, wherein the second cell row is displaced in the row direction relative to the first cell row so that each cell in the second cell row is out of alignment with a corresponding cell in the first cell row.

With this construction, the input pins in corresponding cells of adjacent rows can be displaced relative to each other by a displacement distance in the row direction. As a result, the input signal wires can be substantially straight, and the amount of wiring can be reduced.

The input pins of the cells in the second cell row may be displaced in the row direction relative to the input pins in the cells of the first row.

In each cell, the at least one input pin may be provided toward a first edge that extends in an orthogonal direction to the row direction, and the cells of the second row may displaced relative to the cells in the first row by at least a row direction distance from the first edge to a furthest input pin from the first edge.

With this construction, it can be ensured that the sets of input pins of corresponding cells in adjacent rows are offset from each other.

The semiconductor circuit may further include: a cell set including the first and second cell rows; and a power supply wire or ground wire, wherein the power supply wire or ground wire for the cell set is located directly above the cell set, the power supply wire or ground wire extends in an orthogonal direction to the row direction, and the cells in the set are arranged so that the input pins do not overlap with the wire in plan view.

With this construction, the cells are arranged so that the input pins do not overlap with the power supply line or the ground line. As a result, there is no need reroute wires to the input pins.

The semiconductor circuit may further include: a first cell set including the first and second cell rows; a second cell set including cell rows substantially identical in form to the cell rows of the first cell set; and a signal circuit operable to supply input signals to the cells, wherein the signal circuit supplies a same input signal to cells representing a same bit in the first and second cell sets, and the same-bit cells in the first set align in an orthogonal direction to the row direction with the same-bit cells in the second set.

Here, the signal circuit may supply a plurality of signals to each cell via a plurality of input wires, each cell may have a plurality of input pins, including the at least one input pin, that corresponds in number to the plurality of input wires provided for the each cell; the input pins in each cell are out of alignment with one another both in the row direction and the orthogonal direction.

With this construction, each input pin in a given cell is offset from each of the other input pins in the cell, both in the row direction and in the orthogonal direction to the row direction.

Cells representing certain bits may differ in location in the first cell set and the second cell set.

The semiconductor circuit may further include a buffer provided between a pair of cells adjacent in the row direction.

At least one of the first cell row and the second cell row may include a cell having a cell width that is substantially equal to the cell width of other cells and differing from the other cells in row direction location of the at least one input pin.

This construction uses cells of differing form to enable adjustments to be made to the capacitance between the wires.

The semiconductor circuit of may further have a buffer set including a plurality of buffers operable to drive input signals to the cells, wherein each of the plurality of buffers is substantially in alignment in an orthogonal direction to the row direction with the input pin of a corresponding cell.

Besides enabling the use of straight wires, this construction includes buffers to enable control of the input signals to the cells.

Each buffer may be provided adjacent to the corresponding cell.

With this construction, each buffer is provided close to the corresponding cells: This enables the transition time to be shortened in the input signal to the cells.

The semiconductor circuit may further include a signal circuit operable to supply input signals to the cells, wherein the buffer set includes a prescribed number of buffers, the prescribed number being the number of cells in a prescribed cell row, and the buffer set is provided between the prescribed cell row and a cell row closer to the signal circuit than the prescribed cell row is to the signal circuit.

With this construction, the prescribed number of buffers is provided near the prescribed cell row. This permits the transition time to be shortened in the input signal to the cells.

The semiconductor circuit may further include a signal circuit operable to supply input signals to the cells, wherein the buffer set includes a prescribed number of buffers, the prescribed number being the number of cells in a prescribed cell row, and the buffer set is provided towards the signal circuit in the orthogonal direction so as to be separated from the prescribed cell row by at least a height of the prescribed cell row.

This construction enables the transition time to be shortened at a section of the signal circuit that outputs signals.

The semiconductor circuit may further include: a third cell row that includes a plurality of cells identical in shape to the cells of the first row and is parallel to the first cell row, the cells in the third cell row being displaced in the row direction relative to the cells in both the first and second cell rows; a dense cell set including the first, second and third cell rows that are adjacently disposed in the orthogonal direction; and a clock gating cell or clock buffer cell, wherein the clock gating cell or clock buffer cell is provided in the second cell row so as to be surrounded by cells in the dense cell set.

Here, each cell may have a flip-flop function.

With this construction, a clock gating cell may, for instance, be disposed in the prescribed position to enable suitable control of a clock signal to the surrounding cells.

The present invention is also a semiconductor circuit, comprising a first cell row having a plurality of cells disposed in a row direction, each cell having a prescribed cell width in the row direction and at least one input pin provided at a prescribed location; a second cell row parallel to the first cell row and including reflected cells that are left-right reflected versions of the cells, wherein the prescribed location in the each cell does not coincide with the location of an at least one input pin in a corresponding reflected cell, and the input pins of the cells in the first cell row and the input pins of the cells in the second cell row are arranged so as not to align in an orthogonal direction to the row direction.

With this construction, even if each cell of the first row and each corresponding left-right reflected cell of the second row have identical row direction locations, the input pins in the first row are offset in the row direction relative to the corresponding input pins in the second row. As a result, the input signal wires can be substantially straight, and the amount of wiring can be reduced.

In each cell, the at least one input pin may be provided toward a first edge that extends in the orthogonal direction.

This construction ensures that the offset of the input pin positions in the row direction is provided between cells in the first and second rows.

Each cell in the first cell row may align in the orthogonal direction with a corresponding cell in the second cell row.

With this construction, the region where the cells are disposed can be rectangular, and therefore reduced in width.

BRIEF DESCRIPTION OF THE DRAWINGS

These and other objects, advantages and features of this invention will become apparent from the following description thereof taken in conjunction with the accompanying drawings which illustrate a specific embodiment of the invention.

In the drawings:

FIG. 15 shows in plan view a standard cell array according to an eighth embodiment of the present invention.

DESCRIPTION OF PREFERRED EMBODIMENTS

The following describes embodiments of the present invention with reference to the drawings.

Note that in the following embodiments "input signal" refers to both data signals and enable signals.

First Embodiment

Figure 1:
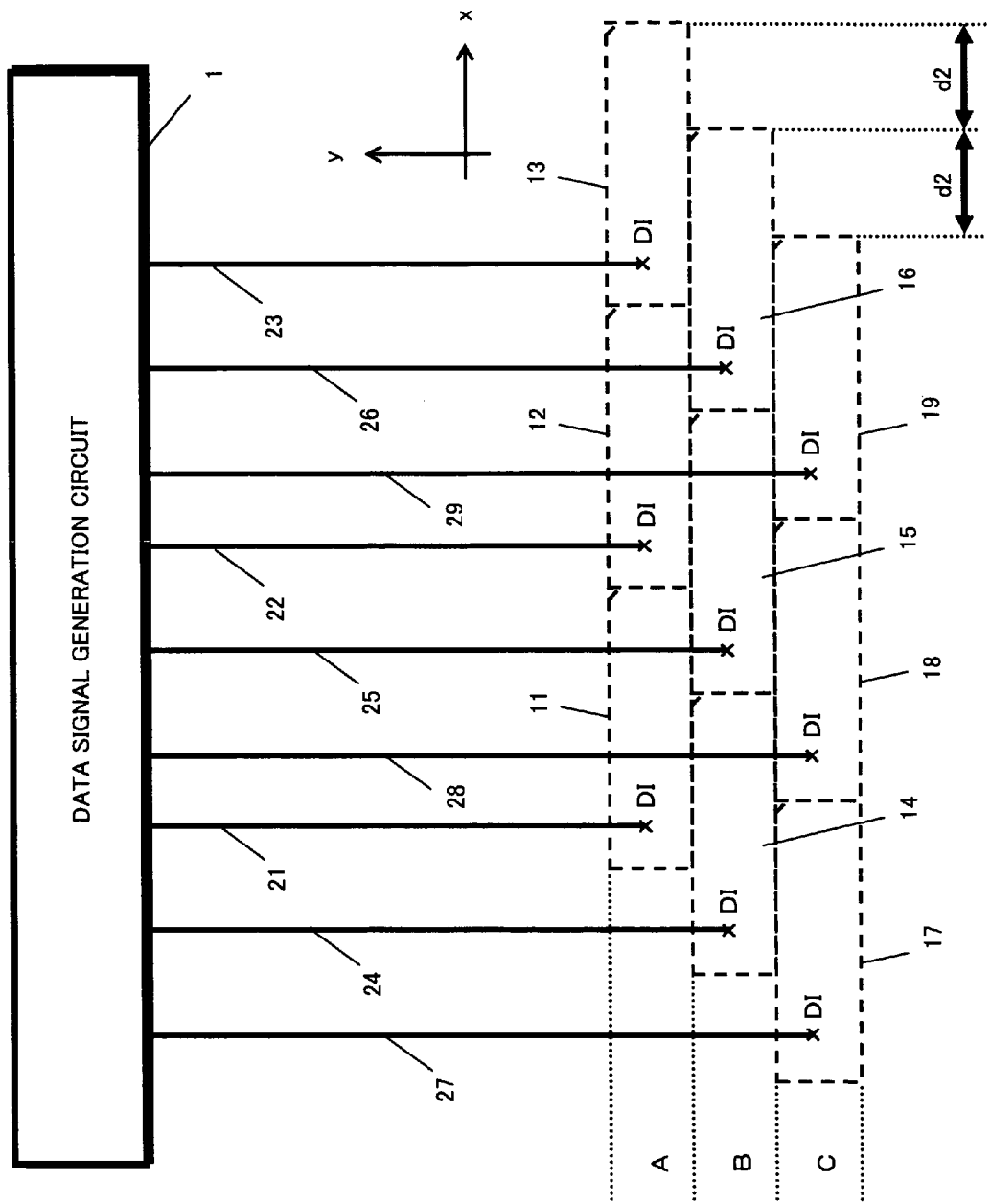
FIG. 1 shows in plan view of a standard cell array according to a first embodiment of the present invention.

FIG. 1 shows in plan view a standard cell array according to a first embodiment of the present invention.

As shown in FIG. 1, standard cells 11 to 19 are shown as nine closely spaced rectangles. The standard cells 11 to 13 are adjacently disposed in a cell width direction (cell row direction). The standard cells 14 to 16, and the standard cells 17 to 19 are similarly disposed. In order to clearly show the locations of the input pins DI, the output pins DO and other pins are not shown. Note that wires 21 to 29 connected to the standard cells 11 to 19 are located in a wiring layer above a layer containing the standard cells. The wires 21 to 29 are shown using solid lines, while the standard cells 11 to 19 are shown using broken lines.

Figure 2:
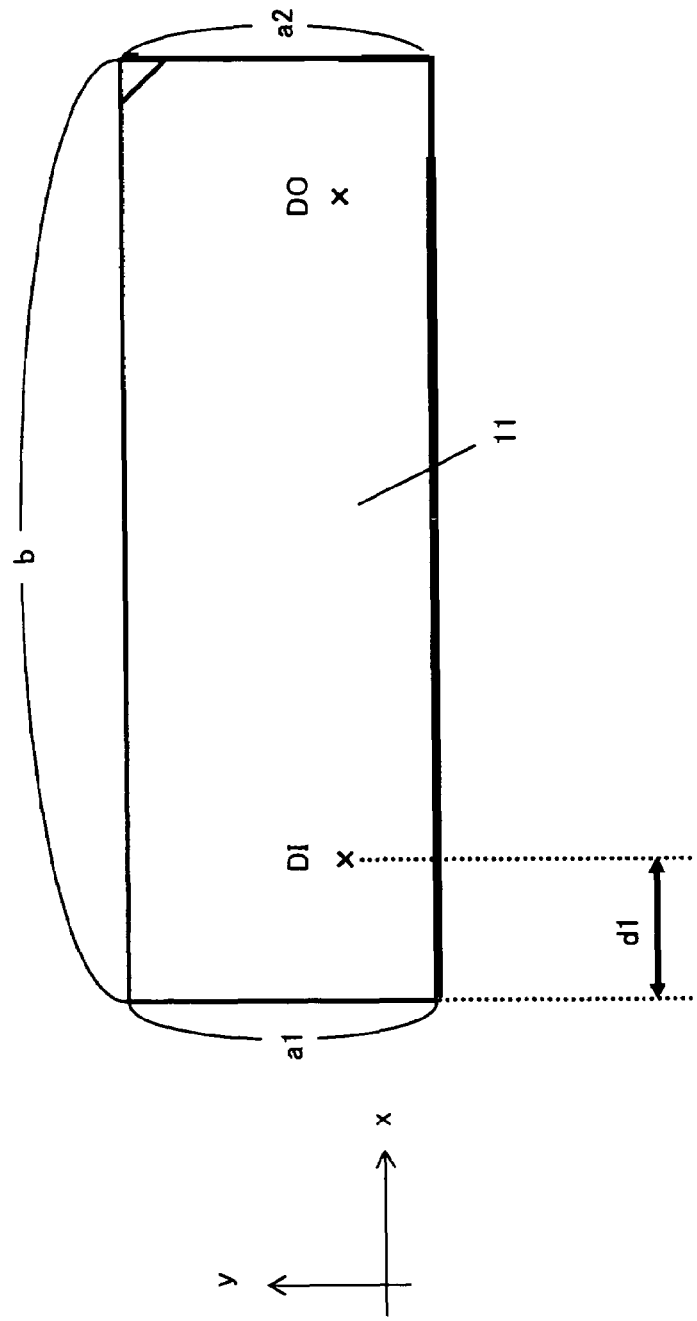
FIG. 2 shows a construction of standard cell 11 shown in FIG. 1.

FIG. 2 shows a construction of standard cell 11 of FIG. 1;

The standard cells 11 to 19 (hereinafter also simply referred to as "cells") are substantially identical in shape. Thus, the following description of standard cell 11 is also applicable to the cells 12 to 19.

As shown in FIG. 2, in this specification a direction parallel to the cell width direction is defined as the x-direction, and a direction orthogonal to the x-direction is defined as the y-direction.

The standard cell 11 is rectangular with short sides that are each typically 4 µm in length and a long side b that extends in the width direction and is typically 30 µm in length.

The standard cell 11 has input pins DI and output pins DO on a main surface thereof. The input pin DI is positioned at a distance d1 in the width direction from one of the short sides a1 and a2. The distance d1 is substantially shorter than the long side b, and is typically of the order of one third of the length of the long side b ($d1 \leq \frac{1}{3}b$).

The standard cells 11 to 19 in FIG. 1 are grouped as follows. The cells 11 to 13 are referred to as cell row A, the cells 14 to 16 as cell row B, and the cells 17 to 19 as cell row C.

A data signal generation circuit 1 is located away from the standard cells 11 to 19 in a direction substantially orthogonal to the width direction. Each of the input pins DI of the cells 11 to 19 connects to a corresponding one of wires 21 to 29, which carry signals outputted by the data signal generation circuit 1.

The wires 21 to 29 are located in a wiring layer above the layer containing the cells 11 to 19, and connect to the input pins DI using via holes not shown in FIG. 1.

The cells 14 to 16 of the cell row B are displaced a distance d2 in the width direction relative to the cells 11 to 13 of the cell row A (i.e. the width direction coordinates of corresponding cells in the respective rows differ by d2).

Similarly, the cells 17 to 19 of the cell row C are displaced a distance d2 relative to the cells 14 to 16 of the cell row B in the same direction as row B is displaced relative to row A.

The distance d2 is substantially equal to the distance d1 (d2=d1).

As described above, each row of the cells 11 to 13, the cells 14 to 16 and the cells 17 to 19 is displaced in the width direction with respect to the cells in the other rows. Thus, the input pins of the respective cells do not align in the orthogonal direction. Consequently, input signal wires 21 to 29 can be provided as straight wires in a single wiring layer.

Optimum Distance d2 When Using Cells Having a Plurality of Input Pins

Figure 3:
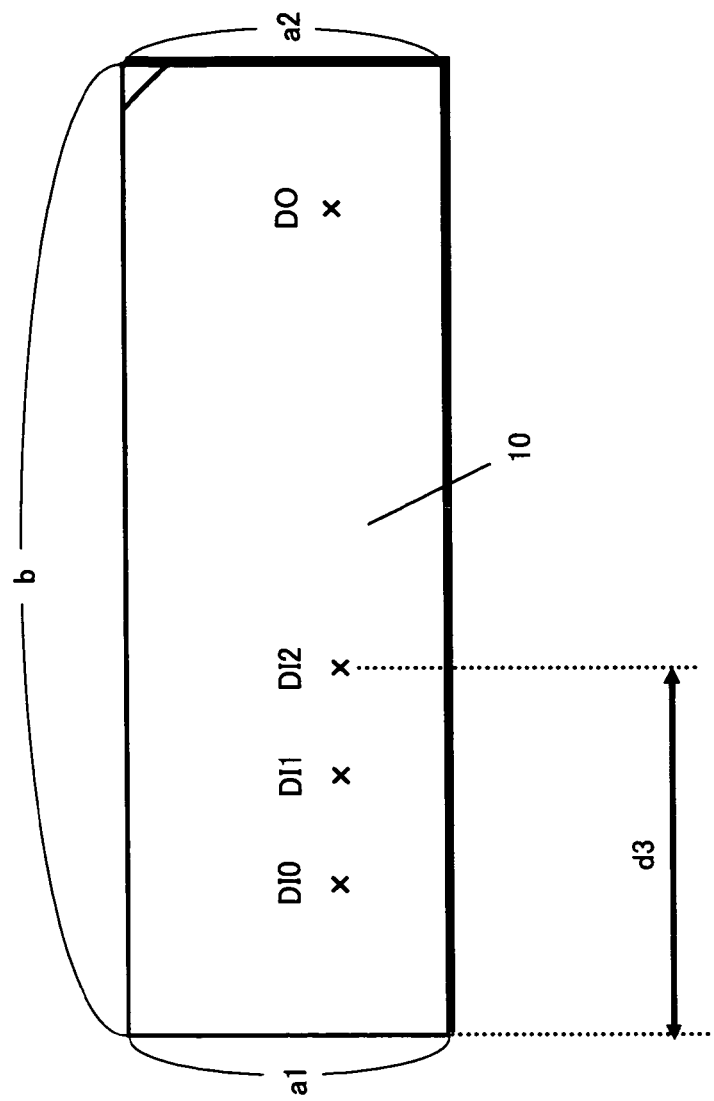
FIG. 3 shows a construction of a standard cell having a plurality of input pins.

FIG. 3 shows a construction of a standard cell having a plurality of input pins.

A standard cell 10 includes three input pins DI0, DI1, and DI2, and an output pin DO.

A plurality of standard cells 10 each having a plurality of input pins is arranged similarly to the array shown in FIG. 1. The resulting displacement in the width direction serves to reduce the amount of wiring required.

In the case of cells resembling the standard cell 10 in having a plurality of input pins, is possible to reduced the amount of wiring required by displacing the cell rows in the width direction as in FIG. 1.

In this case, the displacement distance d2 (see FIG. 1) needs to be greater than a distance d3 to ensure that the width direction locations of the input pins of different rows do not coincide. The distance d3 ($d2 \geq d3$) is measured from the short side a1, which is the nearer of the two short sides a1 and a2 to innermost pin.

The upper limit of the displacement distance d2 is the difference between the long side b and the distance d3 (i.e. $d2 \leq b-d3$).

Second Embodiment

The first embodiment relates to an arrangement in which each cells is substantially identical in cell width and width direction location of the input pins. In a second embodiment, however, certain cells in each row have differing input pin locations. This enables adjustments in wiring capacitance to be made while maintaining straight wires.

Since the second embodiment basically resembles the first embodiment, similar components are marked using the same reference numbers throughout the drawings, and further descriptions are omitted.

Figure 4:
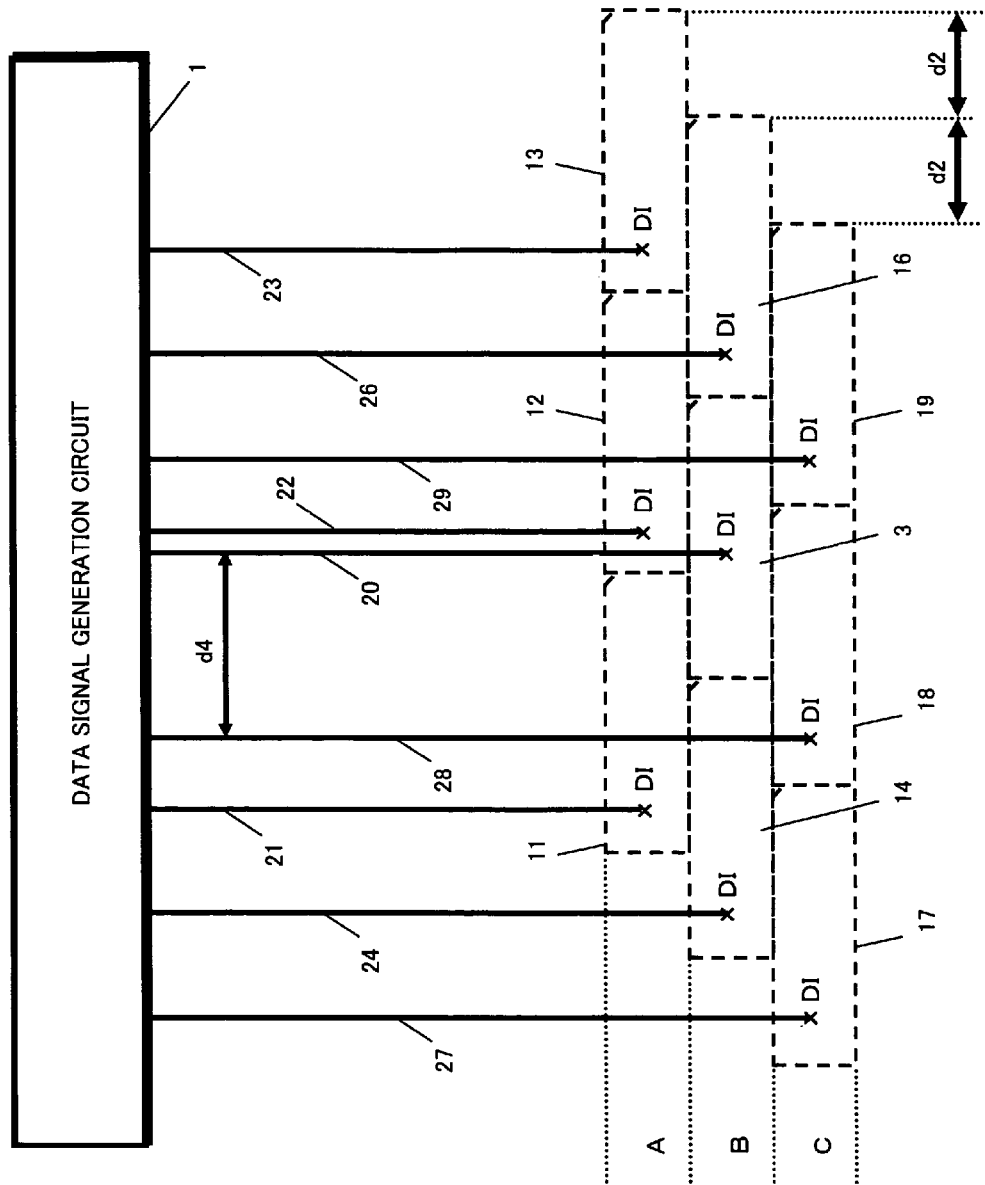
FIG. 4 shows in plan view an standard cell array according to a second embodiment of the present invention.

FIG. 4 shows in plan view a standard cell array according to the second embodiment.

In the second embodiment, a cell 3 is used in place of cell 15 (see FIG. 1) in the second cell in cell row B.

The cell 3 has the same cell width as each of the cells 11 to 14 and the cells 16 to 19, but differs in that the input pin DI is located further towards the center (right-hand side) of the cell.

Thus, the straight wire 20 to the input pin DI of the cell 3 is shifted to the right compared to the first embodiment. As a result, a distance d4 between the wire 28 and the wire 20 is greater than a distance between the wire 28 and the wire 25 (see FIG. 1). Consequently, capacitance between the wire 28 and the wire 20 is reduced.

Third Embodiment

A third embodiment of the present invention relates to a case where the power supply wire is located in the layer above the region where the standard cells are disposed. Here too, adjusting cell locations allows wires connecting to the input pins to be straight.

The third embodiment is described with reference to FIGS. 5 to 7.

Figure 5:
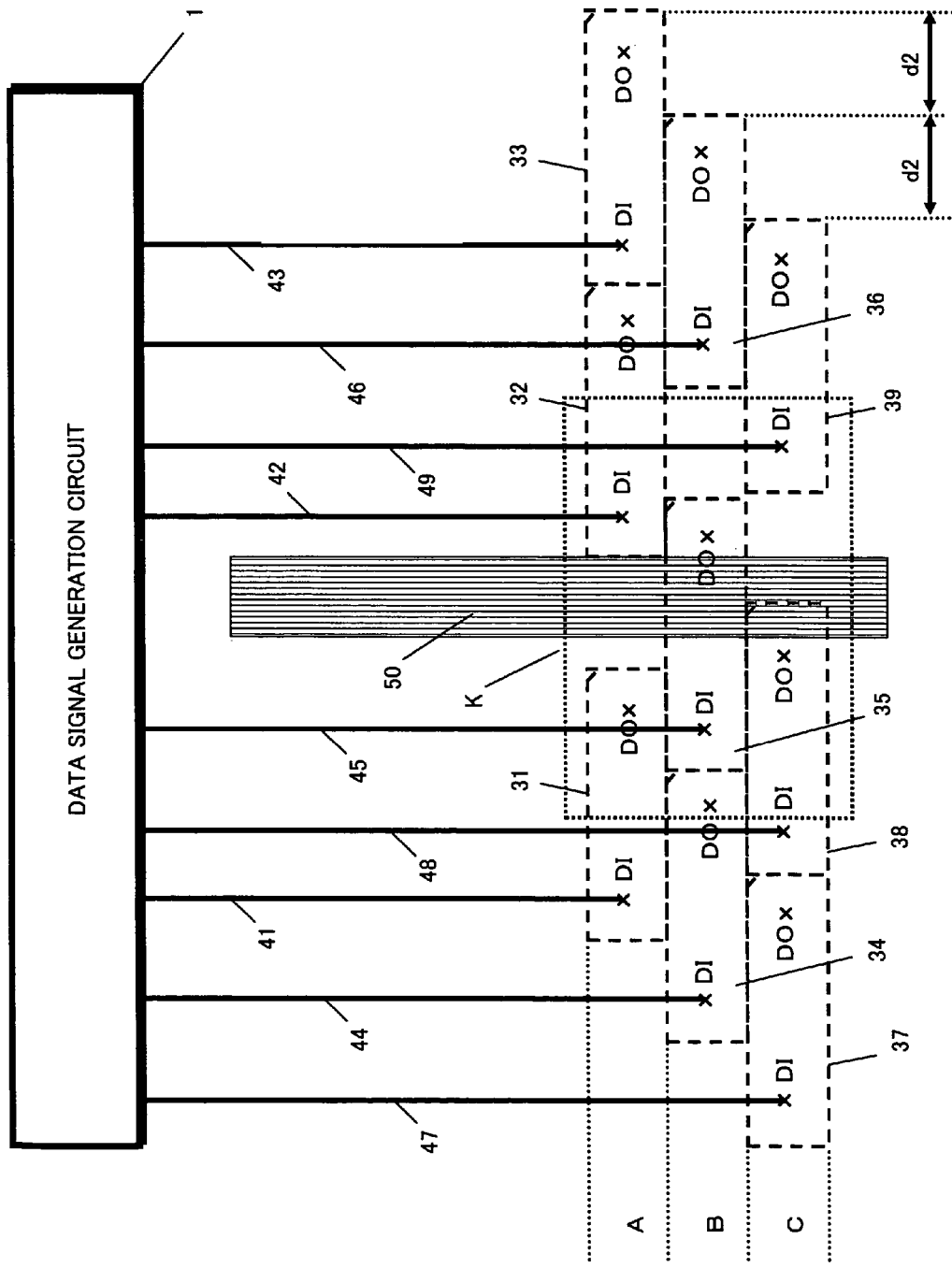
FIG. 5 shows in plan view a standard cells array according to a third embodiment of the present invention, wires 41 to 49 in a wiring layer 2 above the cells, and a power supply wire 50 above the wiring layer 2.

FIG. 5 shows in plan view a standard cell array according to the third embodiment. More specifically, the figure shows wires 41 to 49 in a wiring layer 2 above the cells (see FIG. 7), and a power supply wire 50 above the wiring layer 2 in a wiring layer 3.

The power wire 50 is located in a layer above a central region where the cells 31 to 39 are located.

The cell 32 and the cell 39 are displaced to the right in the width direction so as to be away from the cells 31 and 38 in order to prevent the power wires from overlapping the input pins DI. The cells 33 and 36 are displaced in the width direction the same distance to the right as the cells 32 and 39.

Figure 6:
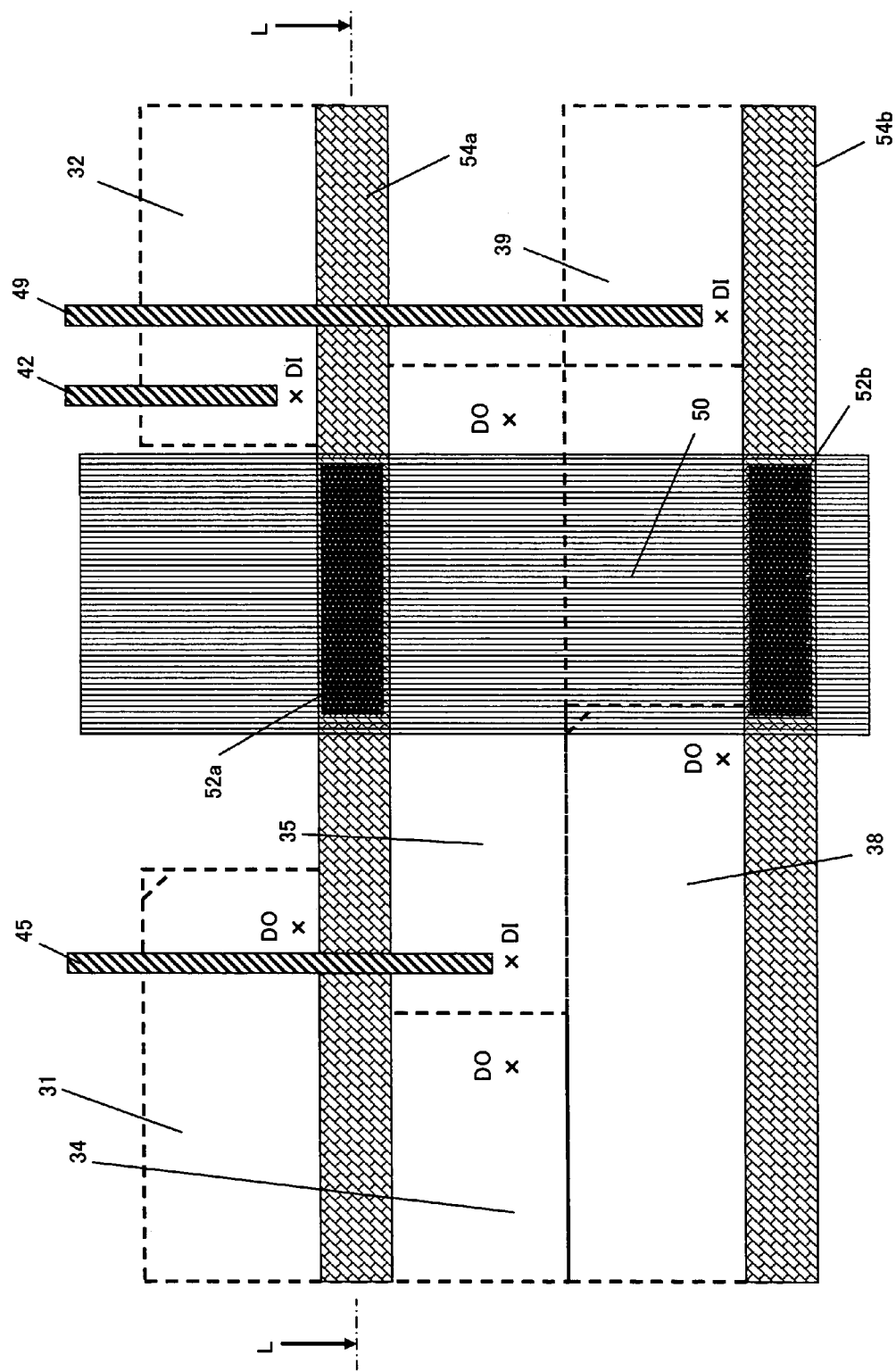
FIG. 6 is an enlargement of a rectangular region K shown in FIG. 5, showing an arrangement of wiring in the three wiring layers.

FIG. 6 is an enlargement of a rectangular region K, showing an arrangement of wiring in the three wiring layers.

Figure 7:
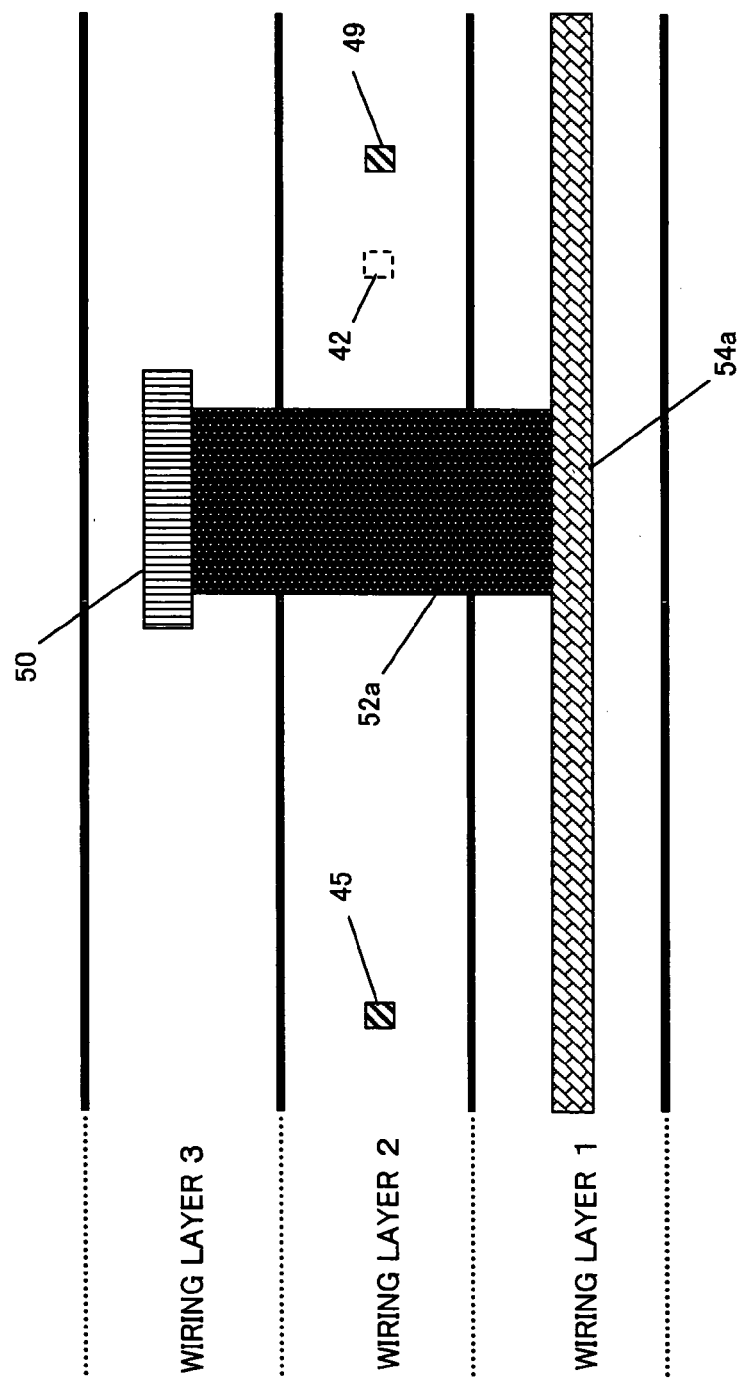
FIG. 7 is a cross-section through L-L in FIG. 6, showing the three wiring layers.

FIG. 7 is a cross-section taken along L-L in FIG. 6, showing the three wiring layers.

As shown in FIG. 7, a wiring layer 3 is composed of a power supply wire 50, a wiring layer 2 is composed of input signal wires 41 to 49, and a wiring layer 1 is composed of power supply wires 54a and 54b.

The power supply wire 50 of the wiring layer 3 is connected to the power supply wires 54a and 54b via power supply vias 52a and 52b.

Since the power supply wire 50 is contained in the wiring layer 3 and the other power supply wires 54a and 54b are contained in the wiring layer 1, the power supply vias 52a and 52b pass through the wiring layer 2.

Consequently, if the locations of the input pins DI of the cells 31 to 39 coincide with the locations of the power supply vias 52a and 52b, it is necessary to route the wires to the input pins around the power supply vias.

However, if the cells 32 and 39 that would normally coincide with the power supply wire 50 are located to avoid coinciding with the power supply wire 50 (and the power connectors 52a and 52b) as in the third embodiment, straight wires can be used.

Fourth Embodiment

In a fourth embodiment of the present invention, a buffer is disposed between the data signal generating circuit and the standard cells. The location of the buffer is adjusted to enable use of straight wires to control the input signals to the cells.

Figure 8:
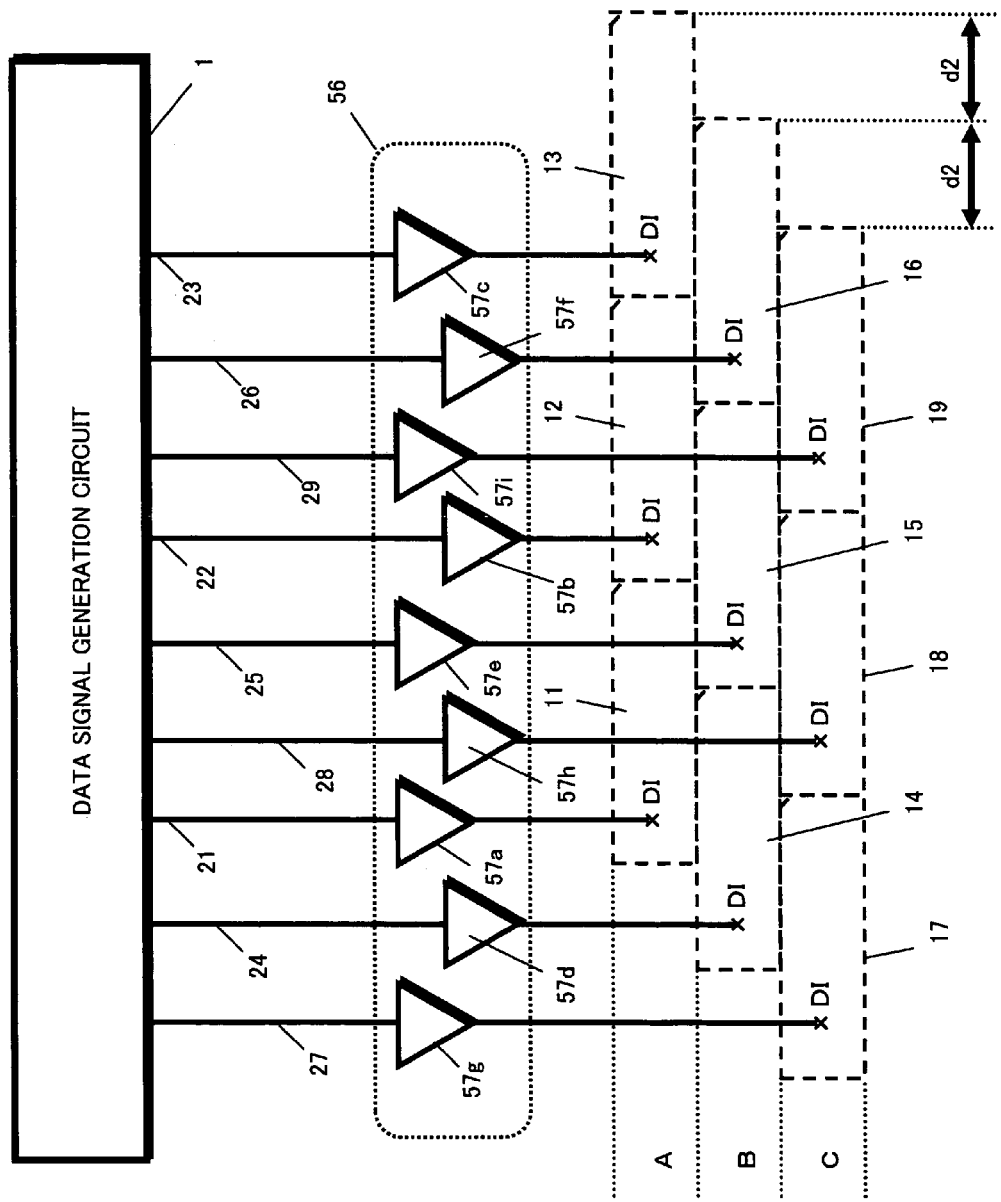
FIG. 8 shows in plan view a standard cell array according to a fourth embodiment of the present invention.

FIG. 8 shows in plan view a standard cell array according to the fourth embodiment.

Repeater buffer set 56 is disposed in proximity to the cells 11 to 19.

A repeater buffer set 56 is composed of repeater buffers 57a to 57i, each of which functions to shorten the transition time.

The repeater buffers 57a to 57i have substantially the same width direction locations as the input pins of the corresponding cells 11 to 19. For instance, the repeater buffer 57a has substantially the same width direction location as the input pin DI of the cell 11.

Consequently, each of the cell 11 to 19 is connected data signal generating circuit 1 using straight wires without being obstructed by the repeater buffers 57a to 57i. In addition the transition time can be shortened for signals outputted from the data signal generating circuit 1 before input to the cells 11 to 19.

The repeater buffers 57a to 57i are disposed in proximity to the data signal circuit 1 (e.g. at a location towards the data signal generation circuit and separated by at least a cell height from cell row A), so that transmission time can be shortened at a location near the data signal circuit 1.

Modification of the Fourth Embodiment

In a modification of the fourth embodiment, the repeater buffer set is located immediately adjacent to the corresponding cell row so as to more effectively shorten the transition time for the input signal to the standard cells.

Figure 9:
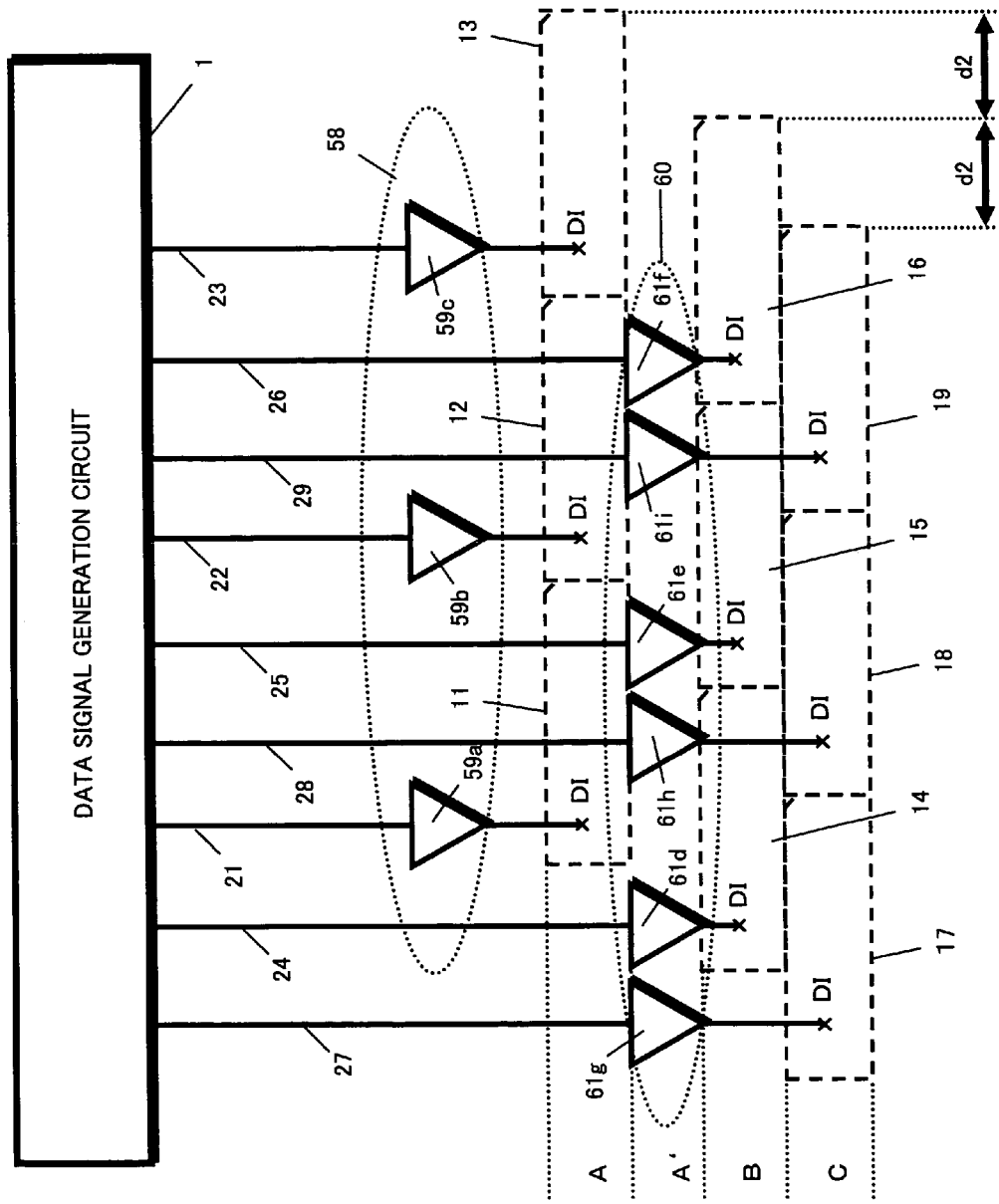
FIG. 9 shows in plan view a of standard cell array according to a modification of the fourth embodiment.

FIG. 9 shows in plan view a standard cell array according to the modification of the fourth embodiment.

As shown in FIG. 9, repeater buffers 59a to 59c (first repeater set 58) are disposed between the input pins DI of the cells 11 to 13 and the data signal generation circuit, in the manner of FIG. 8.

Repeater buffers 61d to 61f (second repeater buffer set 60), on the other hand, are disposed between the cell row A (cells 11 to 13), and cell row B (cells 14 to 16).

In FIG. 9, the second repeater buffer set 60 is shown as the repeater buffer set of row A'.

Inserting the repeater buffer set 60 between cell row A and cell row B in this way enables the transition time to be shortened more effectively in the input signals to cells 14 to 16.

In the fourth embodiment, the repeater buffers are described merely by way of example and without limitation. Any buffer capable of driving input signals to the cell is acceptable.

Fifth Embodiment

In a fifth embodiment of the present invention, a clock gating cell or clock buffer is additionally provided in proximity to the densely integrated standard cells in order to enable control of clock signals between standard cells.

Figure 10:
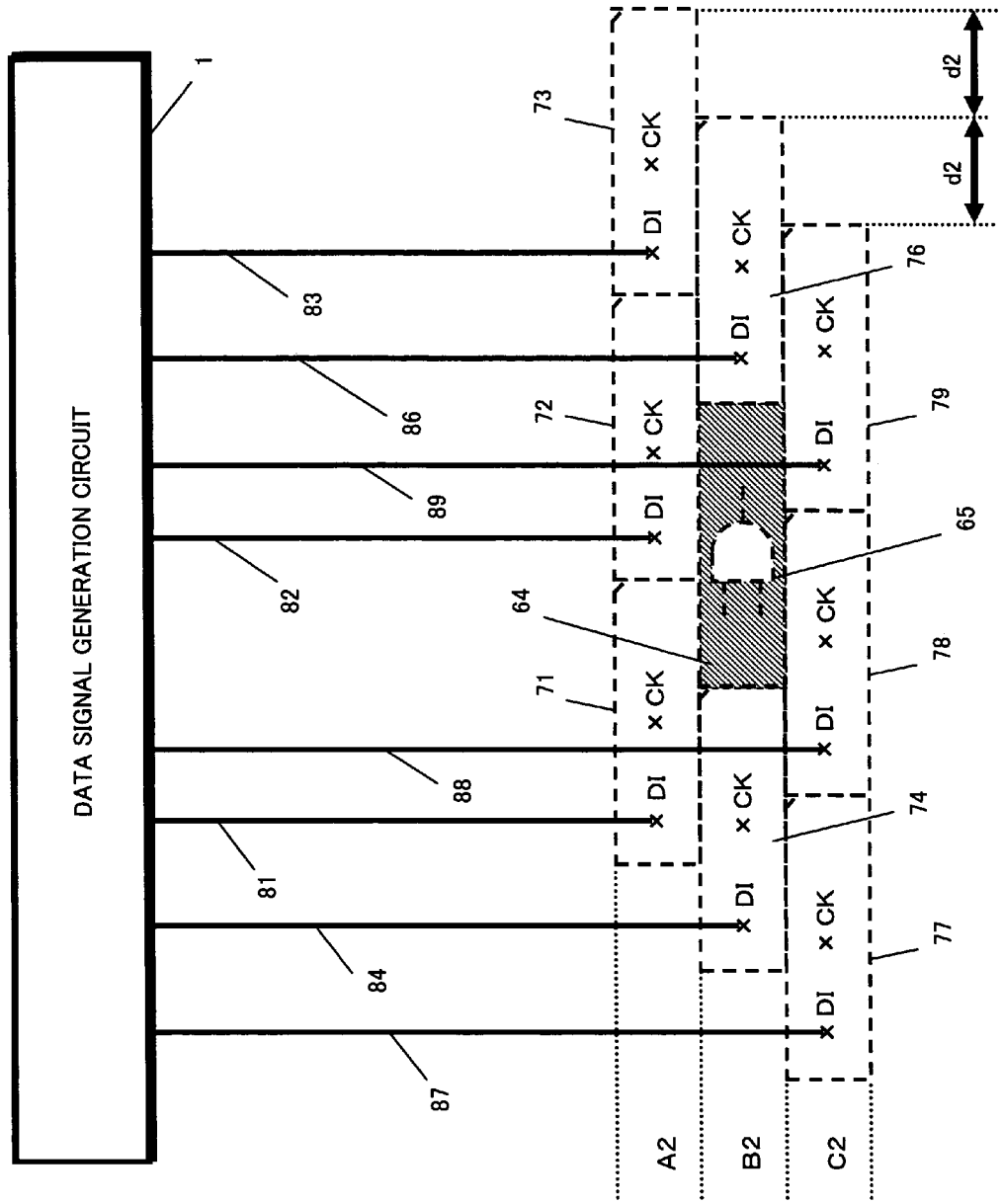
FIG. 10 shows in plan view a standard cell array according to a fifth embodiment of the present invention.

FIG. 10 shows in plan view a standard cell array according to the fifth embodiment.

In the fifth embodiment, an empty region 64 is provided at the location of the second cell in cell row B (i.e. the region surrounded by the 8 cells of cells 71 to 74 and cells 76 to 79).

A clock gating cell 65 is provided in the empty region 64.

Since the clock gating cell 65 is provided at the center of the densely integrated cells 71 to 74 and cells 76 to 79 the lengths of clock wires connecting the clock input pins of the cells 71 to 74 and 76 to 79 are more uniform. This enables a reduction in clock skew occurring among cells subsequent to the clock gating cell 65.

Note that although the fifth embodiment refers to an example in which the clock gating cell is provided in the center of the densely integrated cells, a clock buffer may be provided in place of the clock gating cell. The clock buffer similarly enables suppression of variation in the timing of clock signals between the cells.

Note also that the clock gating cell is not necessarily located in the center of the densely integrated cells. A similar effect can be achieved by providing the clock gating cell at any location close to the densely integrated cells.

Sixth Embodiment

In a sixth embodiment of the present invention, buffers are provided between adjacent cells to enable control of signal transmission between cells.

Figure 11:
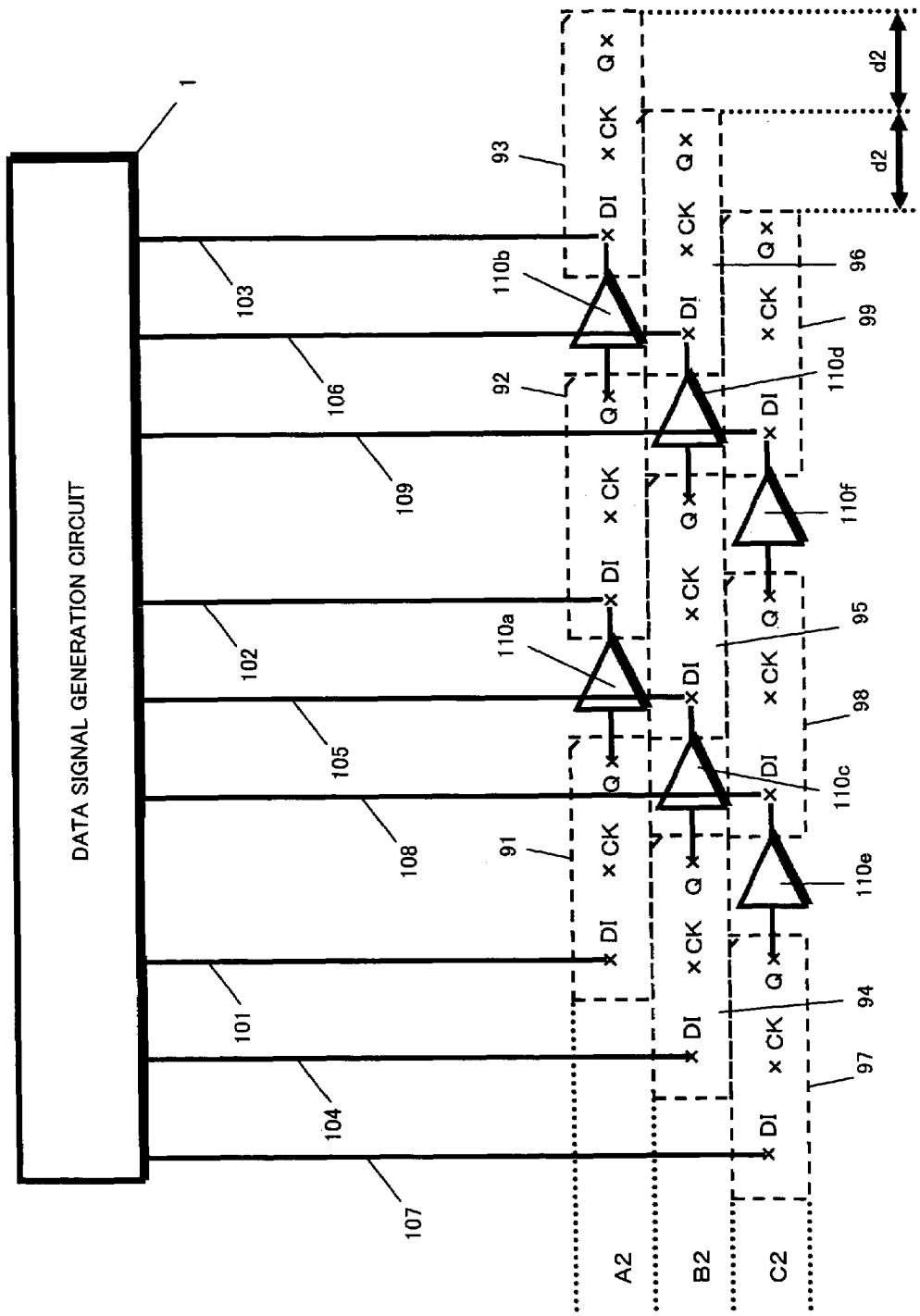
FIG. 11 shows in plan view a standard cell array according to a sixth embodiment of the present invention.

FIG. 11 shows in plan view a standard cell array according to the sixth embodiment.

As shown in FIG. 11, hold buffers 110a to 110f are disposed one between every adjacent cell 91 to 99.

The hold buffers 110a and 110f are located on a line connecting output pin Q and input pin DI of the adjacent cell.

When the standard cells are located adjacent to one another in a densely integrated array, the signal transmission time between cells is very short. As a result, the signal transmission timing between cells may become too early relative to the clock transmission timing.

This situation can be prevented using the construction of the sixth embodiment.

Seventh Embodiment

In a seventh embodiment, cell positions as well as input pin positions in the cells are adjusted to reduce the amount of required wiring for standard cells including bit-slice type data paths.

Figure 12:
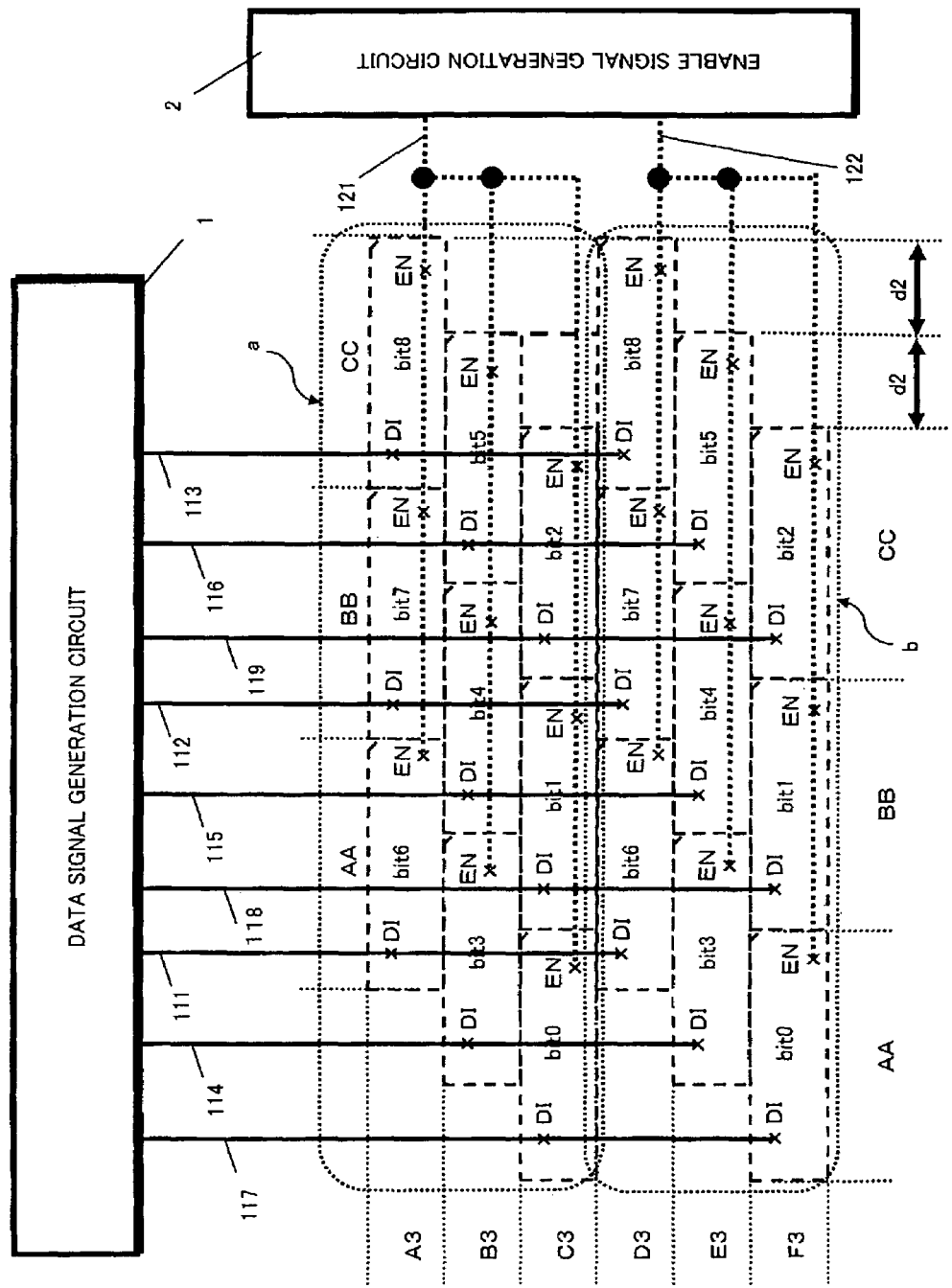
FIG. 12 shows in plan view a standard cell array according to a seventh embodiment of the present invention.

FIG. 12 shows in plan view a standard cell array according to the seventh embodiment.

Rows A3 to F3 each include three cells adjacently disposed in the width direction.

Here, the group of cells including the cell row A3 to cell row C3 are denoted as a "cell set a", and the group of cells including the cell row D3 to cell row F3 are denoted "cell set b".

The width direction location of cells representing a same bit coincide in the cell set a and the cell set b (the input pins DI align in the orthogonal direction to the width direction). Thus, each of straight wires 111 to 119 are shared by the cells representing the same bit in the respective sets.

Each standard cell has an input pin DI in a top-left hand corner of the main surface and an enable pin EN at a bottom-right hand corner of the main surface, and functions as a selector or flip-flop. When the enable signal is applied, the input data is stored by the flip-flop.

The enable signal generation circuit 2 generates enable signals, and supplies a same enable signal to all the cells in the cell set a via a wire 121, and a same enable signal to all the cells in the cell set b via a wire 122. The lateral wires 121 and 122 are located in a different layer to the orthogonal direction wires 111 to 119.

In each cell the pin EN is offset from the pin DI both in the width direction and the orthogonal direction.

Consequently, the wires to the all the EN pins in a given row, such as the wires 121 and 122, can be straight in the width direction without overlapping any of the input pins DI.

As described above, when the circuit includes bit slice-type data path structures, it is possible to adjust the locations of cells that represent the same bit in different cell groups and the locations of input pin positions so that the data input signal wires can be shared. This results in a reduction in the amount of required wiring.

In the seventh embodiment a standard cell having two differing data paths is described as an example. However, the present invention can also be applied to standard cells having more than two input systems.

Modification 1 of the Seventh Embodiment

In modification 1 of the seventh embodiment, in each row a gap is provided between two adjacent cells. In each gap a buffer is provided to control signals between cells of the same row. (i.e. between cells of different columns in the same row).

Figure 13:
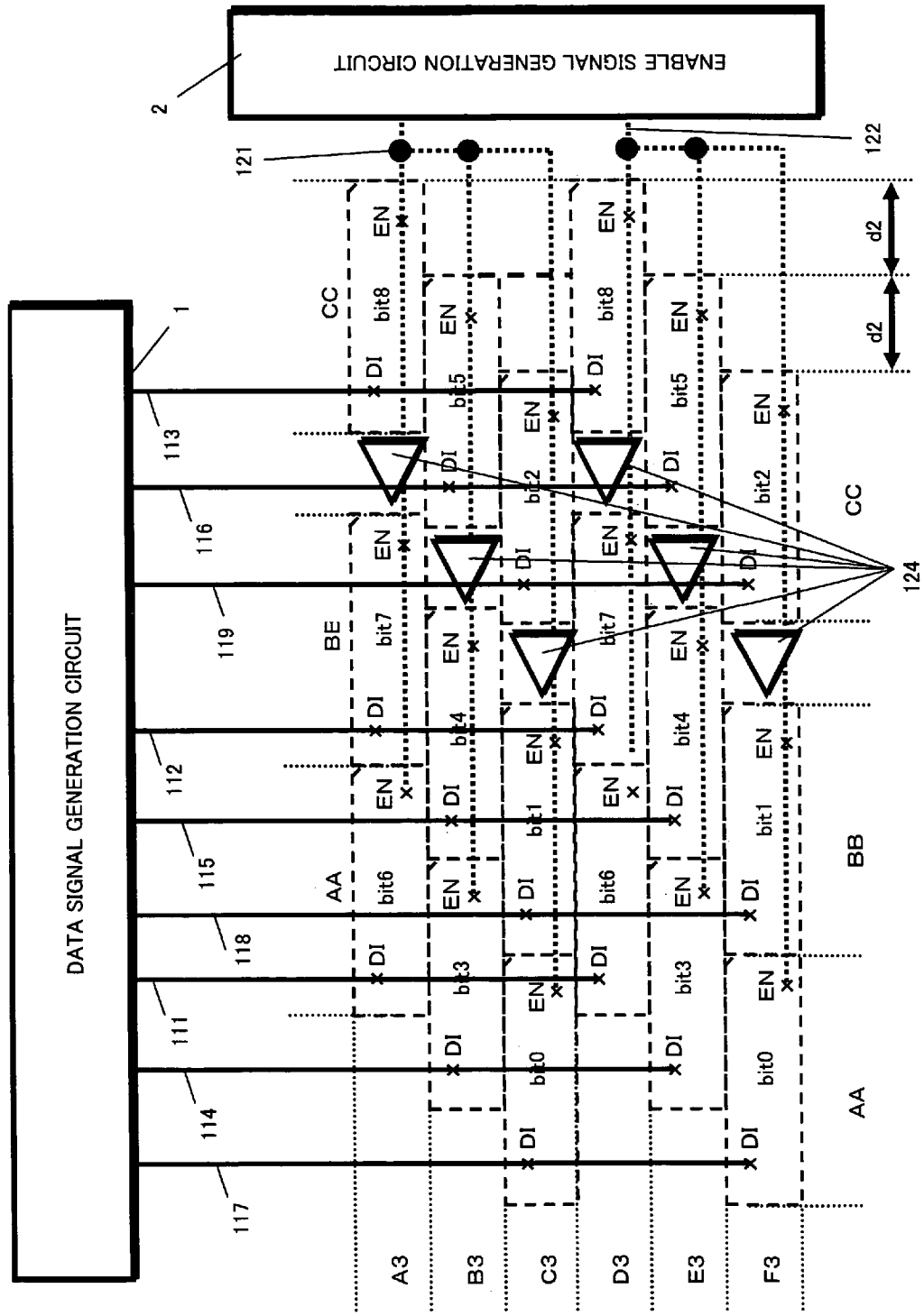
FIG. 13 shows in plan view a standard cell array according to a modification 1 of the seventh embodiment.

FIG. 13 shows in plan view a standard cell array according to the modification 1 of the seventh embodiment.

As shown in FIG. 13, a gap is provided between a second cell (bit 7) and a third cell (bit 8) in cell row A3, and a repeater buffer 124 is provided in the gap.

Providing the repeater buffer 124 in the gap in this way enables the transmission time to be shortened for the enable signals to the second and third cells (bit 7 and bit 8).

Note that the buffer used need not be a repeater buffer. Another type of buffer, such as a hold buffer, is also acceptable.

Modification 2 of the Seventh Embodiment

In a modification 2 of the seventh embodiment one or more cells are intentionally disposed at a different location in the row direction from other cells representing the same bit. The wires must be rerouted to accommodate the differing locations, which results in an increased wiring delay.

Figure 14:
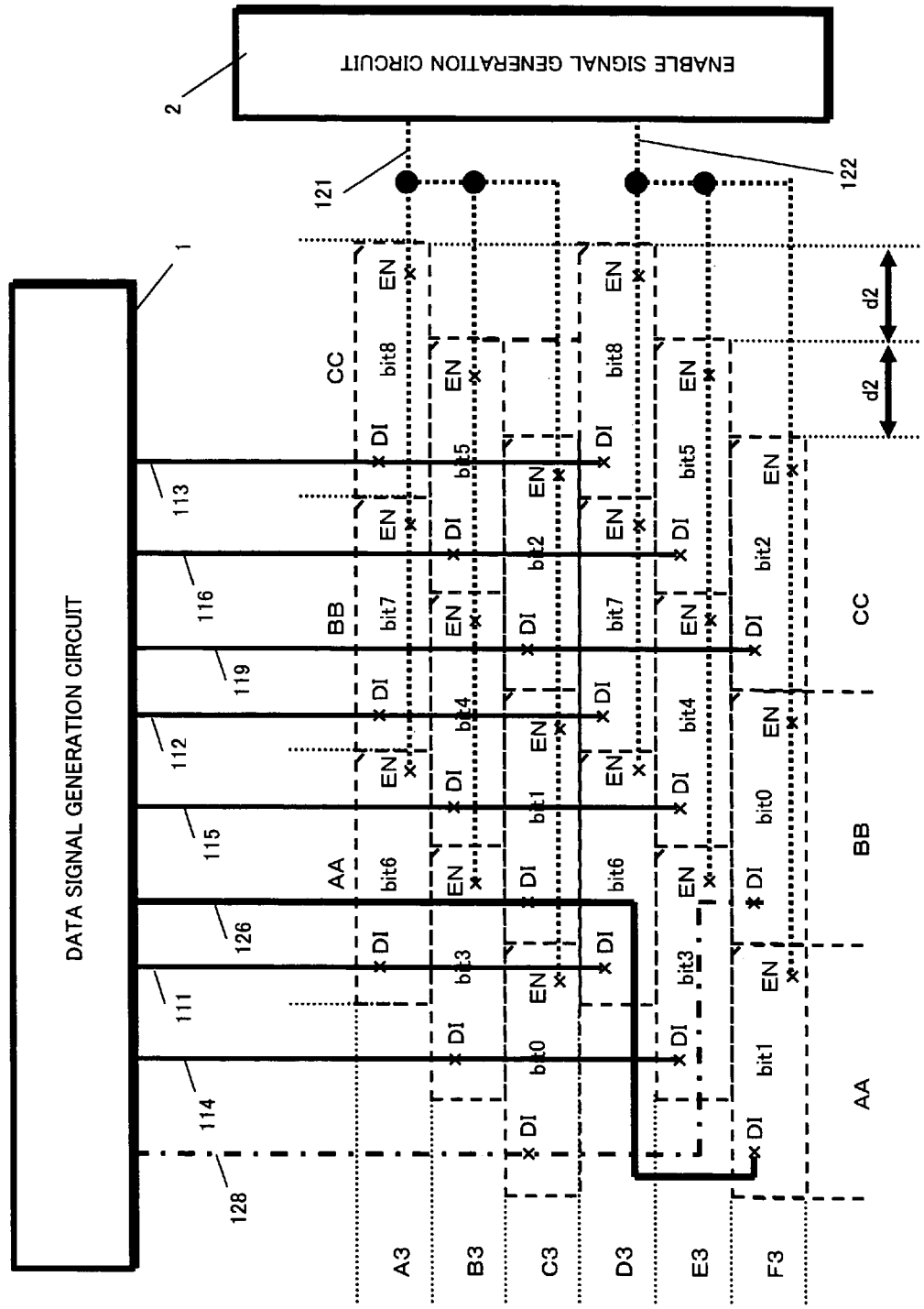
FIG. 14 shows in plan view a standard cell array according to a modification 2 of the seventh embodiment.

FIG. 14 shows in plan view standard cell array according to the modification 2 of the seventh embodiment.

As a comparison of FIG. 14 with FIG. 12 clearly shows, in the modification 2, locations of the first cell (bit 1) and an adjacent second cell (bit 0) have been swapped.

A wire 126 connects to the input pin DI of a first cell of the row F3 and a wire 128 connects to a second cell of the row F3. The first and second cells represent the same bit but differ in width direction location in their respective groups. As a result, the wires 126 and 128 must include turns.

The wire 128 is located in a different layer from the wires 111 to 116, the wire 119, and the wire 126.

Due to the inclusion of portions including turns, some of the wire savings are sacrificed. However the construction enables a wiring delay to be introduced between the cells of column AA and column BB in row F3 without use of a separate hold buffer.

Eighth Embodiment

FIG. 15 shows in plan view a standard cell array according to an eighth embodiment of the present invention.

Cell row A1 is constructed from standard cells 131 to 133, and cell row B1 from cell row 134 to 136. In contrast to the other embodiments, the cells of differing rows have substantially the same width direction locations (i.e. the cells of the cell row 1 and the cell row A2 are aligned in an orthogonal direction to the width direction).

Cells 131 to 133 of cell row A1, and cells 134 to 136 of cell row B1 have substantially the same cell width, and input pins DI that are left-right symmetrical between rows. Cells 134 to 136 may be referred to as reflected cells of cells 131 to 133.

The input pins DI in the cells 134 to 136 in the cell row B1 do not align in the orthogonal direction with input pins DI in the cell row B1. It is therefore possible to use straight wires for the wires 144 to 146 to the cells 134 to 136 of the cell row B1.

In the eighth embodiment, the case where the invention is applied to input pins located towards the left edge of each cell is described. However, the present invention is not limited to this case, and may be applied to any construction as long as the input pins locations in the cells do not coincide under left-right reflection.

Moreover, the present invention may be any combination of the eighth embodiment and the second to seventh embodiments.

Notes (1) In each of the above embodiments, standard cell method semiconductor circuits are described. However, the present invention is not limited to being applied to this method, and may be applied to other method.

Although the present invention has been fully described by way of examples with reference to the accompanying drawings, it is to be noted that various changes and modifications will be apparent to those skilled in the art.

Therefore, unless otherwise such changes and modifications depart from the scope of the present invention, they should be construed as being included therein.

What is claimed is:

1. A semiconductor circuit, comprising:
   a first cell row including a plurality of cells disposed in a row direction, each cell having a prescribed cell width in the row direction and at least one input pin provided at a prescribed location in the row direction; and
   a second cell row that includes a plurality of cells substantially identical in shape to cells of the first row and is parallel to the first cell row, wherein
   the second cell row is displaced in the row direction relative to the first cell row so that each cell in the second cell row is out of alignment with a corresponding cell in the first cell row,
   in each cell, the at least one input pin is provided toward a first edge, and
   the cells of the second row are displaced relative to the cells in the first row by at least a row direction distance from the first edge to a furthest input pin from the first edge.

2. The semiconductor circuit of claim 1, wherein the input pins of the cells in the second cell row are displaced in the row direction relative to the input pins in the cells of the first row.

3. The semiconductor circuit of claim 1, wherein
   the furthest input pin from the first edge is provided toward the first edge.

4. The semiconductor circuit of claim 1, further comprising:
   a cell set including the first and second cell rows; and
   a power supply wire or ground wire, wherein
   the power supply wire or ground wire for the cell set is located directly above the cell set,
   the power supply wire or ground wire extends in an orthogonal direction to the row direction, and
   the cells in the set are arranged so that the input pins do not overlap with the wire in plan view.

5. The semiconductor circuit of claim 1, further comprising:
   a first cell set including the first and second cell rows;
   a second cell set including cell rows substantially identical in form to the cell rows of the first cell set; and
   a signal circuit operable to supply input signals to the cells, wherein
   the signal circuit supplies a same input signal to cells representing a same bit in the first and second cell sets, and the same-bit cells in the first set align in an orthogonal direction to the row direction with the same-bit cells in the second set.

6. The semiconductor circuit of claim 5, wherein
   the signal circuit supplies a plurality of signals to each cell via a plurality of input wires,
   each cell has a plurality of input pins, including the at least one input pin, that corresponds in number to the plurality of input wires provided for the each cell;
   the input pins in each cell are out of alignment with one another both in the row direction and the orthogonal direction.

7. The semiconductor circuit of claim 5, wherein cells representing certain bits differ in location in the first cell set and the second cell set.

8. The semiconductor circuit of claim 1, further comprising a buffer provided between a pair of cells adjacent in the row direction.

9. The semiconductor circuit of claim 1, wherein at least one of the first cell row and the second cell row includes a cell having a cell width substantially equal to the cell width of other cells and differing from the other cells in row direction location of the at least one input pin.

10. The semiconductor circuit of claim 1, further comprising:
    a buffer set including a plurality of buffers operable to drive input signals to the cells,
    wherein each of the plurality of buffers is substantially in alignment in an orthogonal direction to the row direction with the input pin of a corresponding cell.

11. The semiconductor circuit of claim 10, wherein each buffer is provided adjacent to the corresponding cell.

12. The semiconductor circuit of claim 10, further comprising:
    a signal circuit operable to supply input signals to the cells, wherein
    the buffer set includes a prescribed number of buffers, the prescribed number being the number of cells in a prescribed cell row, and
    the buffer set is provided between the prescribed cell row and a cell row closer to the signal circuit than the prescribed cell row is to the signal circuit.

13. The semiconductor circuit of claim 10, further comprising
    a signal circuit operable to supply input signals to the cells, wherein
    the buffer set includes a prescribed number of buffers, the prescribed number being the number of cells in a prescribed cell row, and
    the buffer set is provided towards the signal circuit in the orthogonal direction so as to be separated from the prescribed cell row by at least a height of the prescribed cell row.

14. The semiconductor circuit of claim 1, further comprising:
    a third cell row that includes a plurality of cells identical in shape to the cells of the first row and is parallel to the first cell row, the cells in the third cell row being displaced in the row direction relative to the cells in both the first and second cell rows;
    a dense cell set including the first, second and third cell rows that are adjacently disposed in the orthogonal direction; and
    a clock gating cell or clock buffer cell, wherein
    the clock gating cell or clock buffer cell is provided in the second cell row so as to be surrounded by cells in the dense cell set.

15. The semiconductor circuit of claim 1, wherein each cell has a flip-flop function.

16. A semiconductor circuit, comprising:
    a first cell row including a plurality of cells disposed in a row direction, each cell having a prescribed cell width in the row direction and a plurality of input pins provided at prescribed locations in the row direction; and
    a second cell row that includes a plurality of cells substantially identical in shape to cells of the first row and is parallel to the first cell row, wherein
    the second cell row is displaced in the row direction relative to the first cell row so that each cell in the second cell row is out of alignment with a corresponding cell in the first cell row,
    in each cell, the plurality of input pins are provided toward a first edge, and
    the cells of the second row are displaced relative to the cells in the first row by at least a row direction distance from the first edge to a furthest input pin from the first edge, said furthest input pin disposed in a line formed by the plurality of input pins.

* * * * *